United States Patent [19]
Nishihara et al.

[11] Patent Number: 5,554,222
[45] Date of Patent: Sep. 10, 1996

[54] IONIZATION DEPOSITION APPARATUS

[75] Inventors: Munekazu Nishihara, Neyagawa; Masahide Yokoyama, Hirakata; Hatsuhiko Shibasaki, Ibaraki; Youichi Ohnishi, Higashiosaka, all of Japan

[73] Assignee: Matsushita Electric Industrial Co., Ltd., Osaka-fu, Japan

[21] Appl. No.: 501,698

[22] Filed: Jul. 12, 1995

Related U.S. Application Data

[63] Continuation of Ser. No. 69,684, May 28, 1993, abandoned.

[30] Foreign Application Priority Data

Jun. 1, 1992 [JP] Japan .................................. 4-140653

[51] Int. Cl.[6] .................................................. C23C 16/00
[52] U.S. Cl. ..................... 118/723 HC; 118/724; 118/725; 118/730; 156/627.1
[58] Field of Search ........................... 118/723 HC, 724, 118/725, 730; 156/627.1

[56] References Cited

U.S. PATENT DOCUMENTS

| | | | |
|---|---|---|---|
| 4,859,490 | 8/1989 | Ikegaya et al. | 427/573 |
| 5,058,527 | 10/1991 | Ohta et al. | 118/723 HC |
| 5,146,481 | 9/1992 | Garg et al. | 156/DIG. 68 X |

FOREIGN PATENT DOCUMENTS

| | | |
|---|---|---|
| 62-105340 | 5/1987 | Japan . |
| 3-134937 | 7/1991 | Japan . |

OTHER PUBLICATIONS

"Miniaturization and Weight–saving Technique for a New Model of Brenby", Nikkei Mechanical, Aug. 5, 1991, pp. 46–49 (partial translation).

Primary Examiner—R. Bruce Breneman
Assistant Examiner—Joni Y. Chang
Attorney, Agent, or Firm—Wenderoth, Lind & Ponack

[57] ABSTRACT

An ionization deposition apparatus includes an ion source which is located in a vacuum chamber and which is provided with gas introduction ports for supplying a gaseous film material into the vacuum chamber, a filament unit, which is separated into a plurality of independently controllable filaments, for generating thermoelectrons when the filaments are heated by filament currents, and an anode electrode for accelerating and colliding the thermoelectrons against molecules of the gaseous film material to thereby turn the molecules to plasma. A holder for holding a to-be-deposited object, the holder being placed confronting the anode electrode of the ion source in the vacuum chamber, and connected to a bias source to attract ions in the plasma to a surface of the holder.

6 Claims, 2 Drawing Sheets

IONIZATION DEPOSITION APPARATUS

This application is a Continuation of now abandoned application, Ser. No. 08/069,684, filed May 28, 1993.

SPECIFICATION

BACKGROUND OF THE INVENTION

The present invention relates to an ionization deposition apparatus to be used in the surface treatment of mechanical parts or in the manufacture of semiconductors.

The ionization deposition apparatus is employed to form a highly adhesive thin film on the surface of an object. More specifically, in the ionization deposition apparatus, a solid film material is melted and evaporated to obtain a gaseous material, which is then turned to a plasma. Charged particle ions in the plasma are made to collide with high energy against an object to which a high voltage is impressed, whereby, a highly adhesive thin film is formed on the surface of the object.

Lately, a CVD method employing a gaseous film material use has been used to form high quality films in the manufacture of semiconductors.

A conventional ionization deposition apparatus will be first described with reference to FIG. 2.

As shown in FIG. 2, depicting the structure of a conventional ionization deposition apparatus, provides in a vacuum chamber 1 are an ion source A and a base material holder (holder for a to-be-deposited object) 6 placed opposed to the ion source A for holding and rotating a base material (to-be-deposited object) 7. The vacuum chamber 1 has a vacuum discharge port 2 to discharge a gas within the chamber 1 to outside the apparatus. The ion source A includes a gas introduction port 3' for introducing a gaseous film material 3, a filament 4 for generating thermoelectrons responsive to a filament current, and an anode electrode 5 for accelerating the thermoelectrons 80 as to collide against the gas molecules, thereby turning the gas molecules into a plasma. In this example, the filament 4 is connected to a filament source 8, and the anode electrode 5 is connected to an anode source 9, and the holder 6 is provided with a high voltage bias source 10.

The conventional ionization deposition apparatus of the above-described structure operates in a manner as will be discussed hereinbelow with reference to FIG. 2.

In FIG. 2, the vacuum chamber 1 is evacuated to high vacuum (approximately $10^{-7}$ Torr) by a vacuum pump (not shown) through the vacuum discharge port 2. The gaseous film material 3 of a constant flow rate is supplied from the gas introduction port 3' into the vacuum chamber 1 and, the pressure of the gaseous film material 3 in the vacuum chamber 1 is maintained to be about $10^{-4}$–$10^{-3}$ Torr. Then, a 20A–40A current is fed to the filament 4 from the filament source 8, whereby the filament 4 generates thermoelectrons. At this time, the thermoelectrons are accelerated towards the anode electrode 5 by impressing a positive voltage to the anode electrode 5 from the anode source 9. The thermoelectrons collide against the gaseous molecules of the film material gas 3 the area of the ion source A. The molecules are consequently separated into positive and negative ions, thereby generating a plasma of the gaseous film material 3 in the ion source A. In this state, when a high negative voltage is applied to the holder 6 by the high voltage bias source 10, only the positively charged ions of the gaseous film material 3 in the plasma are accelerated to collide the base material 7 with high kinetic energy. As a result, a thin film composed of the positive ions of the gaseous film material 3 is formed on the surface of the base material 7. The ions derived from the ion source A can be detected as a current (bias current) running in the bias source 10.

In the structure of the conventional apparatus as above, many ions are concentrated directly above the position where the filament 4 is located. If the base material 7 facing the filament 4 has a large area, the thickness of the film formed on the base material 7 immediately above the filament 4 becomes large, thereby causing irregularity in the distribution of the film thickness. That is, a uniform film is difficult to obtain. Moreover, since the base material 7 is heated by radiation heat from the filament 4, in the case where an amorphous film is to be formed, the adhesion between the base material 7 and the formed film is made, and the film is thus undesirably delaminated. Further, since the film gradually adheres to the surface of the filament 4 over time, the amount of generated thermoelectrons decreases even if the current flowing in the filament 4 is kept constant, and the amount of the bias current is lowered as a time elapses. A resulting drawback is that the film thickness is varied among successive lots.

SUMMARY OF THE INVENTION

The object of the present invention is therefore to provide an ionization deposition apparatus which is capable of stably forming for a long duration a film with uniform thickness and high adhesive strength on a base material (to-be-deposited object) having a large area.

In accomplishing these and other objects, according to a first aspect of the present invention, there is provided an ionization deposition apparatus which includes: an ion source which is located in a vacuum chamber and is provided with gas introduction ports for supplying a gaseous film material into the vacuum chamber, a filament unit, which is formed by a plurality of independent filaments for independently controlling an amount corresponding each of filament currents in the ion source, for generating thermoelectrons when the filaments are heated by the filament currents, and an anode electrode for accelerating and colliding the thermoelectrons against molecules of the gaseous material to thereby turn the molecules to plasma, and a holder for holding a to-be-deposited object. The holder is placed confronting the anode electrode of the ion source in the vacuum chamber, and is connected to a bias source to attract ions in the plasma to a surface of the holder.

In the ionization deposition apparatus of the present invention, the filament unit for generating the thermoelectrons is divided into the plurality of independent filaments in the ion source. The current amount of each filament is independently controllable. Therefore, many ions are concentrated and generated in a direction immediately above each of the filaments, thus making it possible to generate ions uniformly over the distributing area of the plurality of independent filaments. A film of uniform thickness can be formed even for an object having a large area.

According to a second aspect of the present invention, the ionization deposition apparatus described above further includes a control unit for controlling the filament currents so as to maintain a bias current flowing in the bias source constant.

When the filament current is so controlled as to maintain the bias current in the bias source constant, the formation rate of the films is maintained at a fixed value. Accordingly, the variation of the film thickness among lots as in the prior art is eliminated and a thin film of stable film thickness can be obtained simply by controlling the time for forming each film.

According to a third aspect of the present invention, the ionization deposition apparatus described above further includes a cooling unit for cooling the holder.

When the holder for the to-be-deposited object is designed to be cooled, the radiation heat from the filament can be discharged outside due to the arrangement of the cooling unit such as a heat sink. Therefore, the object is prevented from being heated by the radiation heat, and the adhesion between the object and the film, particularly, between the object and an amorphous film, is not decreased and thus the film is prevented from being detached from the object.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1:
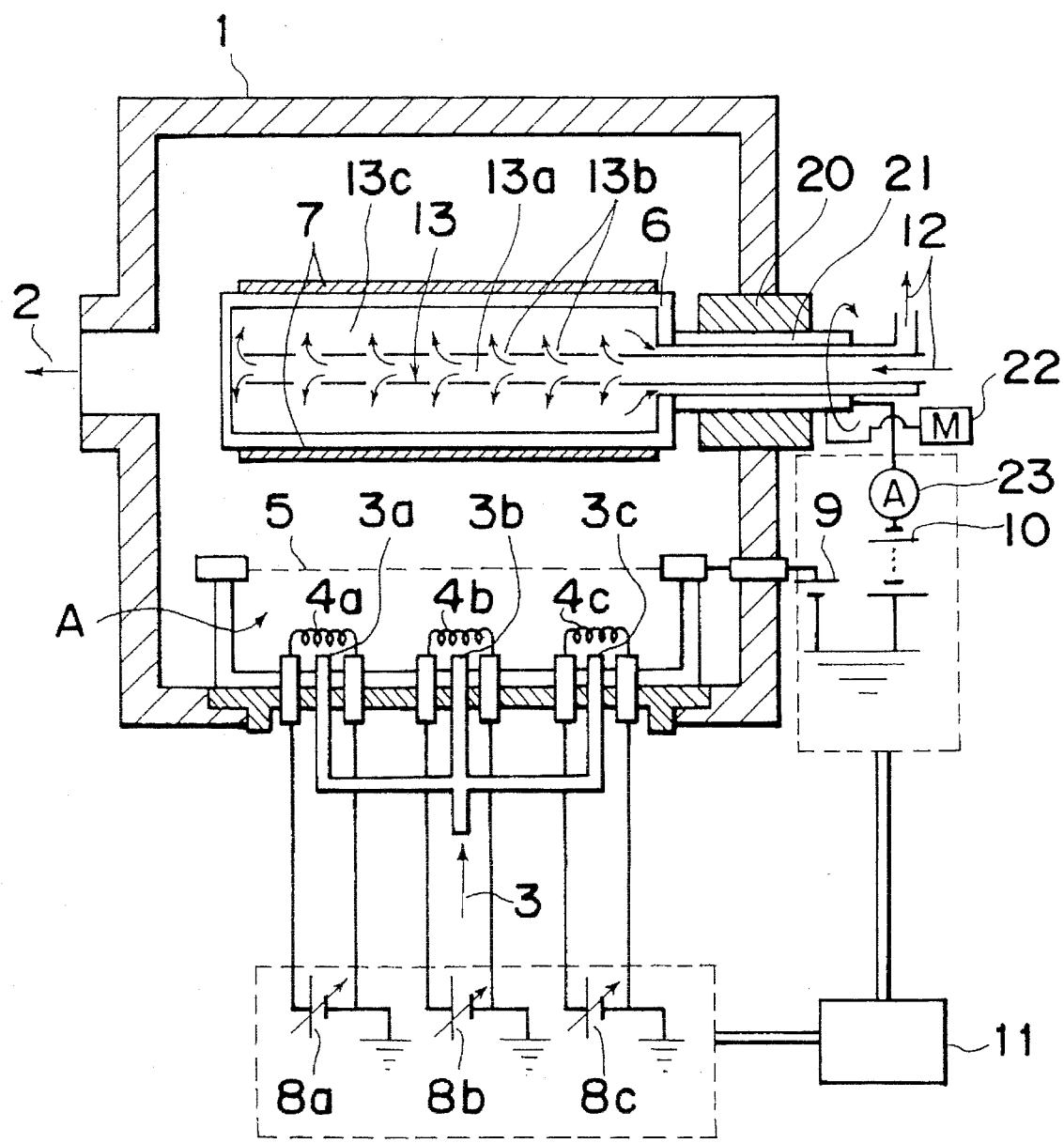
FIG. 1 is a front view showing an ionization deposition apparatus according to one preferred embodiment of the present invention.
Figure 2:
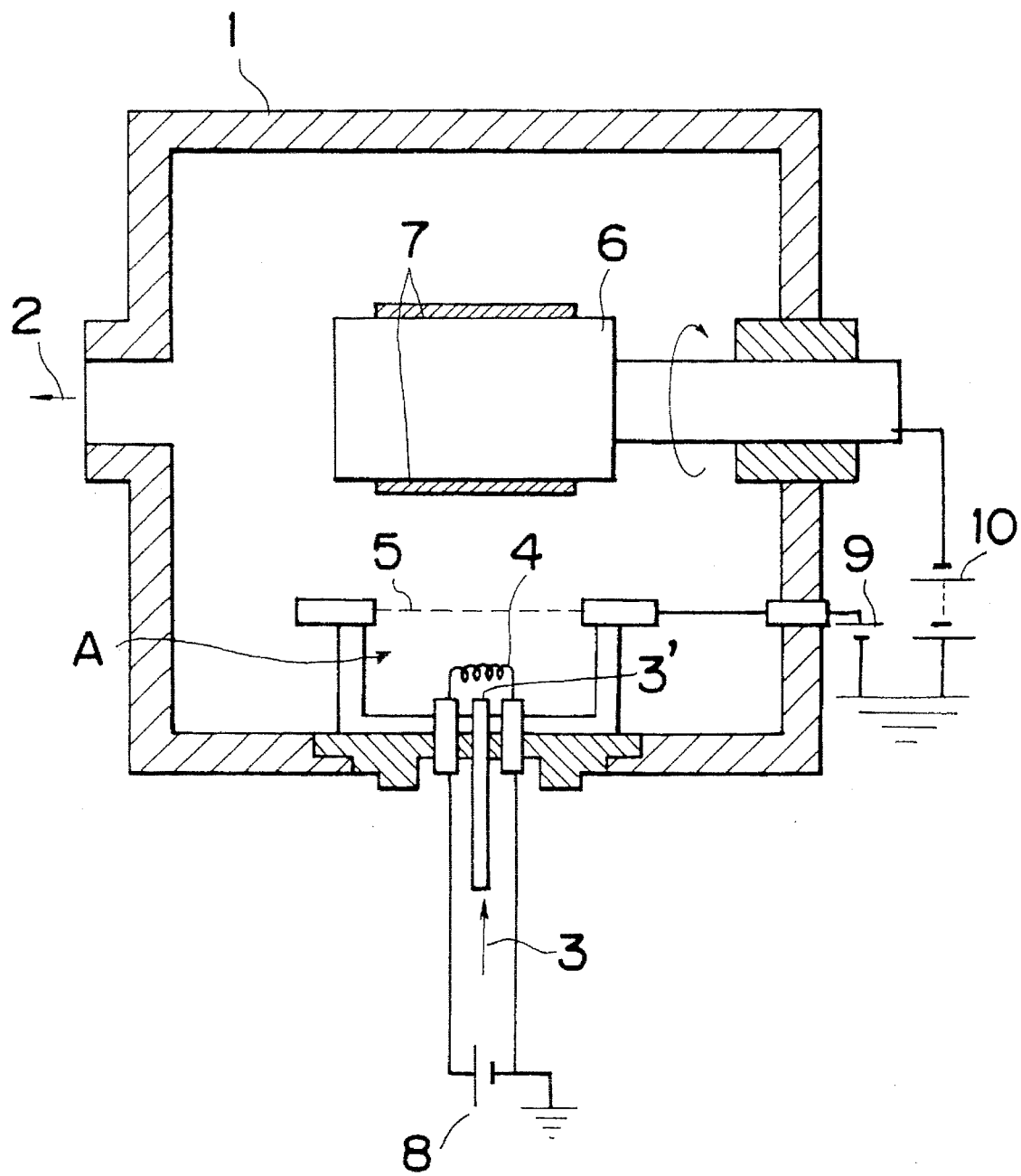
FIG. 2 is a front view showing a conventional ionization deposition apparatus.

Before the description of the present invention proceeds, it is to be noted that like parts are designated by like reference numerals throughout the accompanying drawings.

An ionization deposition apparatus according to one preferred embodiment of the present invention will be described with reference to FIG. 1.

In FIG. 1, an ionization deposition apparatus of the embodiment is provided with an ion source A and a base material holder (holder for a to-be-deposited object) 6 in a vacuum chamber 1. The ion source A includes a plurality of gas introduction ports 3a, 3b, 3c for introducing a gaseous film material 3 into the vacuum chamber 1, filaments 4a, 4b, 4c respectively arranged in the vicinity of the gas introduction ports 3a, 3b, 3c to generate thermoelectrons responsive a filament current, and a meshy anode electrode 5 for accelerating the thermoelectrons from the filaments 4a, 4b, 4c to collide with the molecules of the gaseous film material 3, thereby turning the gaseous molecules of the film material into plasma. A vacuum discharge port 2 formed in the vacuum chamber 1 discharges a gas from inside the chamber 1. A base material (to-be-deposited object) 7 placed confronting the ion source A is held and rotated by the holder 6. A voltage is applied to the holder 6 to attract the ions in the plasma. In this embodiment, the filaments 4a, 4b, 4c are provided with filament sources 8a, 8b, 8c, respectively, and the anode electrode 5 has an anode source 9. On the other hand, a high voltage bias source 10 is used for the holder 6. A control unit 11 independently controls the filament sources 8a, 8b, 8c, the anode source 9, and the bias source 10. The holder 6 is cooled by a cooling water 12 flowing in a circulating cooling unit 13 built in the holder 6. The cooling water 12 flows within an inner tube 13a having many holes 13b and arranged in an outer tube 13c, and then flows through the holes 13b into the outer tube 13c so as to discharge the cooling water 12 to effectively cool the holder 6. Then, the cooling water 12 is returned to outside the holder 6. On the other hand, the holder 6 is rotatably supported by a magnetic fluid seal 21 supported by the wall of the vacuum chamber 1 through an insulating member 20. The holder 6 is rotated by a driving device 22 such as a motor at a constant speed. The holder 6 has a rectangular parallelepiped or cylinder configuration having the base material 7 on its surface.

The operation of the ionization deposition apparatus will now be discussed with reference to FIG. 1.

Referring to FIG. 1, the vacuum chamber 1 is evacuated to a high degree of vacuum ($10^{-7}$ Torr or so) by a vacuum pump (not shown) through the vacuum discharge port 2. When a gaseous film material 3 of a constant flow rate is supplied into the vacuum chamber 1 through the gas introduction ports 3a, 3b, 3c, the pressure of the gaseous film material 3 in the vacuum chamber 1 is maintained to be approximately $10^{-4}$–$10^{-3}$ Torr. Approximately 20A–40A currents are respectively fed to the filaments 4a, 4b, 4c by the filament sources 8a, 8b, 8c, whereby thermoelectrons are generated from the filaments 4a, 4b, 4c. At this time, when a positive voltage is applied to the anode electrode 5 by the anode source 9, the thermoelectrons generated from the filaments 4a, 4b, 4c are accelerated towards the anode electrode 5 to collide with the molecules of the gaseous film material 3 inside the ion source A, so that the molecules are separated into positive and negative ions. Accordingly, plasma of the gaseous film material 3 is generated in the ion source A. At this time, the gaseous film material 3 of the same flow rate is supplied immediately below each of the filaments 4a, 4b, 4c, and therefore, it is possible to generate plasma of the same density from every filament 4a, 4b, 4c. When the filament current of each filament 4a, 4b, 4c is controlled independently by the corresponding filament source 8a, 8b, 8c by the control unit 11 based on the voltage of the bias source 10, the density distribution of plasma in the ion source A of large area can be controlled to be uniform. If necessary, the current flowing in the conductive holder 6 may be measured by a commercially-available ammeter 23 and then the measured current value may be used to control the filament sources 8a, 8b, 8c. While a negative high voltage is applied to the holder 6 by the high voltage bias source 10 in the state as above, only the ions of positive charges in the plasma are accelerated and brought to collide against the base material 7 with high kinetic energy. As a result, a thin film of uniform thickness is formed of the positive ions of the gaseous film material 3 on the surface of the base material 7 of large area.

In the case where the ionization deposition apparatus is continuously driven in the manufacturing process, the film adheres even to the surface of the filaments 4a, 4b, 4c as a time elapses. If the filament current is constant, the generating amount of the thermoelectrons is reduced and the bias current running in the bias source 10 is lowered due to adhesion of the film also adheres onto the filaments 4a, 4b, 4c. Under such circumstances, therefore, the embodiment makes an arrangement for the control unit 11 to monitor the bias current using the ammeter 23 and to feed back the decrease of the bias current, to control the current amounts of the filament sources 8a, 8b, 8c in maintain a constant bias current in the bias source 10 at all times. Because of the above arrangement, even if a film is adhered to the surface of the filaments 4a, 4b, 4c during the continuous operation of the apparatus, it is possible to form thin films at a stable rate for every lot. Accordingly, the operator need only manage the formation, time to obtain thin films having a same thickness.

For example, the control unit 11 may effect control so that the filament currents of initial set values initially flow in the filaments 4a, 4b, 4c, and then change a ratio of all the filament currents so as to maintain the bias current flowing in the bias source 10 constant. Such initial set values are pre-determined under operator's experience or observation of an operator.

Since the base material holder 6 of the ionization deposition apparatus is cooled by the cooling water 12 running in the interior of the circulating cooling unit 13, the thermal energy of the radiation heat which the base material 7 and the holder 6 have received from the plurality of the filaments 4a, 4b, 4c can be absorbed through the circulation of the cooling water 12, with the temperature rise of the base material 7 being suppressed. Therefore, the adhesive strength between the base material 7 and a film, e.g., an amorphous film, can be improved.

According to the embodiment, there are provided three filaments. However, any number of filaments may be used. Although the base material holder 6 is adapted to be rotated around an axis parallel to the longitudinal direction of the ion source A, it is possible to rotate the holder 6 around an axis perpendicular to the longitudinal direction of the ion source A in the case where a thin film is to be formed on a semiconductor wafer, or to keep the holder 6 stationary confronting the ion source A.

In the present invention, a plurality of independent filaments are provided to generate thermoelectrons in the ion source, and the amount of the current to be supplied to the filaments is controllable for every filament. Therefore, many ions are generated concentrating in a direction right above each of the filaments, whereby the ions are uniformly dispersed in the whole area where the filaments are disposed. Accordingly, a uniform thin film is formed even on an object of large area.

Further, the control unit of the present ionization deposition apparatus controls the current of each filament so as to maintain the bias current in the bias source constant. Therefore, the formation rate of films is kept constant, thus eliminating the irregularity of the film thickness between the formed lots, unlike the prior art. Accordingly, only if the formation time is controlled, a thin film of stable thickness is obtained.

When the holder for a to-be-deposited object is designed to be cooled, the radiation heat from the filaments can be discharged. The conventional problem is hence prevented in which the object is heated by the radiation heat from the filaments, and the adhesion between the object and the film is lowered, resulting in delamination of the film in the case of an amorphous film.

One example of the embodiment will be described below. The bias source 10 has a voltage of 3000 V, the anode source 9 has a voltage of 100 V, and the filament sources 8a, 8b, 8c of the filaments 4a, 4b, 4c made of tantalum are in the range from 30 through 40A. The flow rate of the gaseous film material 3 of $C_6H_6$ is 4 sccm. The pressure in the vacuum chamber 1 is 0.8 mTorr. The holder 6 rotates at 10 rpm. The temperature of the holder 6 is 250° C. when cooled by the circulating cooling unit 13, while the temperature of the holder 6 is 400° C. when not cooled by the circulating cooling unit 13. The thickness of the film 7 made of Diamond-like carbon is 200 Å/min.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An ionization deposition apparatus which comprises:

an ion source which is located in a vacuum chamber, said ion source including (1) gas introduction ports for supplying a gaseous film material into the vacuum chamber, (2) a filament unit, which includes a plurality of independent filaments for which respective current amounts of filament currents flowing in said filaments are independently controlled, for generating thermoelectrons when the filaments are heated by the filament currents, and an (3) anode electrode for accelerating and colliding the thermoelectrons against molecules of the gaseous film material to turn the molecules to plasma;

a holder for holding a to-be-deposited object, the holder being placed confronting to the anode electrode of the ion source in the vacuum chamber, and connected to a bias source to attract ions in the plasma to a surface of the holder;

a bias current detector for detecting a bias current of said bias source; and a control unit for changing a ratio of all the filament currents so as to maintain the detected bias current constant.

2. The ionization deposition apparatus according to claim 1, wherein said control unit controls the filament currents so as to maintain the bias current flowing in the bias source constant.

3. The ionization deposition apparatus according to claim 2, wherein the control unit controls the filament currents so that the filament currents flowing in the filaments initially have preset values and then a ratio of all the filament currents is varied so as to maintain the bias current flowing in the bias source constant.

4. The ionization deposition apparatus according to claim 1, further comprising a cooling unit for cooling the holder.

5. The ionization deposition apparatus according to claim 1, further comprising a driving device for rotating the holder about its axis.

6. An ionization deposition apparatus which comprises:

an ion source which is located in a vacuum chamber, said ion source including (1) gas introduction ports for supplying a gaseous film material into the vacuum chamber, (2) a filament unit, which includes a plurality of independent filaments for which respective current amounts of filament currents flowing in said filaments are independently controlled, for generating thermoelectrons when the filaments are heated by the filament currents, and an (3) anode electrode for accelerating and colliding the thermoelectrons against molecules of the gaseous film material to turn the molecules to plasma;

a holder for holding a to-be-deposited object, the holder being placed confronting the anode electrode of the ion source in the vacuum chamber, and connected to a bias source to attract ions in the plasma to a surface of the holder;

a bias current detector for detecting a bias current of said bias source;

a control unit for changing a ratio of all of the filament currents so as to maintain the detected bias current constant; and a circulating unit contained within said holder for circulating a coolant fluid within said holder, said circulating unit including an inner fluid cavity extending lengthwise within said holder and coupled to a fluid inlet, an outer fluid cavity extending lengthwise within said holder surrounding said inner fluid cavity and coupled to a fluid outlet, and a plurality of fluid openings extending between said inner fluid cavity and said outer fluid cavity.

* * * * *